United States Patent
Vobecky et al.

(10) Patent No.: US 12,513,928 B2
(45) Date of Patent: Dec. 30, 2025

(54) BIDIRECTIONAL THYRISTOR DEVICE

(71) Applicant: HITACHI ENERGY LTD, Zürich (CH)

(72) Inventors: Jan Vobecky, Prague (CZ); Umamaheswara Vemulapati, Windisch (CH)

(73) Assignee: HITACHI ENERGY LTD, Zürich (CH)

( * ) Notice: Subject to any disclaimer, the term of this patent is extended or adjusted under 35 U.S.C. 154(b) by 426 days.

(21) Appl. No.: 18/038,652

(22) PCT Filed: Nov. 22, 2021

(86) PCT No.: PCT/EP2021/082491
§ 371 (c)(1),
(2) Date: May 24, 2023

(87) PCT Pub. No.: WO2022/112169
PCT Pub. Date: Jun. 2, 2022

(65) Prior Publication Data
US 2024/0038880 A1 Feb. 1, 2024

(30) Foreign Application Priority Data
Nov. 25, 2020 (EP) .................................... 20209815

(51) Int. Cl.
*H10D 18/00* (2025.01)
*H10D 18/80* (2025.01)
*H10D 62/10* (2025.01)

(52) U.S. Cl.
CPC ........... *H10D 18/80* (2025.01); *H10D 18/221* (2025.01); *H10D 62/126* (2025.01)

(58) Field of Classification Search
CPC .. H10D 62/141; H10D 62/142; H10D 62/148; H10D 62/192; H10D 62/199;
(Continued)

(56) References Cited

U.S. PATENT DOCUMENTS

| 4,812,893 | A | | 3/1989 | Bacuvier |
| 4,816,892 | A | * | 3/1989 | Temple .................. H10D 30/66 |
| | | | | 257/E29.257 |

(Continued)

FOREIGN PATENT DOCUMENTS

| CN | 202332860 U | 7/2012 |
| CN | 107258018 A | 10/2017 |

(Continued)

OTHER PUBLICATIONS

Vobecky et al., "Bidirectional Phase Control Thyristor (BiPCT): A new antiparallel thyristor concept", Published in: 2020 32nd International Symposium on Power Semiconductor Devices and ICs (ISPSD), Sep. 13-18, 2020, DOI: 10.1109/ISPSD46842.2020. 9170072, 4 pages.

*Primary Examiner* — Eric A. Ward
(74) *Attorney, Agent, or Firm* — Procopio, Cory, Hargreaves & Savitch LLP (57) ABSTRACT

A bidirectional thyristor device (1) comprising a semiconductor body (2) extending between a first main surface (21) and a second main surface (22), is provided wherein a first main electrode (31) and a first gate electrode (41) are arranged on the first main surface and a second main electrode (32) and a second gate electrode (42) are arranged on the second main surface. The first main electrode comprises a plurality of first segments (310) that are spaced apart from one another, wherein at least some of the first segments are completely surrounded by the first gate electrode in a view onto the first main surface. The second main electrode comprises a plurality of second segments (320) that are spaced apart from one another, wherein at least some of the second segments are completely surrounded by the second gate electrode in a view onto the second main surface.

15 Claims, 5 Drawing Sheets

(58) Field of Classification Search
CPC ...... H10D 62/206; H10D 18/00; H10D 18/01; H10D 18/021; H10D 18/031; H10D 18/211; H10D 18/221; H10D 18/241; H10D 18/40; H10D 18/60; H10D 18/65; H10D 18/80; H10D 18/655; H10D 64/233; H10D 64/291; H10D 84/676
See application file for complete search history.

(56) References Cited

U.S. PATENT DOCUMENTS

| | | | |
|---|---|---|---|
| 5,021,855 A | | 6/1991 | Oikawa et al. |
| 5,483,087 A | * | 1/1996 | Ajit .................. H10D 18/40 |
| | | | 257/128 |
| 5,914,503 A | * | 6/1999 | Iwamuro ............ H10D 18/655 |
| | | | 257/330 |
| 5,936,267 A | * | 8/1999 | Iwamuro ........... H10D 84/0105 |
| | | | 257/152 |
| 5,969,922 A | | 10/1999 | Pezzani |
| 6,054,728 A | * | 4/2000 | Harada ................. H10D 18/40 |
| | | | 257/152 |
| 6,091,087 A | * | 7/2000 | Iwamuro ............. H10D 18/655 |
| | | | 257/133 |
| 2005/0245006 A1 | | 11/2005 | Tseng |
| 2007/0051972 A1 | | 3/2007 | Schulze et al. |
| 2017/0250256 A1 | | 8/2017 | Siemieniec et al. |
| 2017/0294435 A1 | * | 10/2017 | Rahimo ............... H10D 84/131 |
| 2020/0411674 A1 | * | 12/2020 | Vobecky ............. H10D 84/131 |

FOREIGN PATENT DOCUMENTS

| | | |
|---|---|---|
| CN | 108063164 A | 5/2018 |
| CN | 108899360 A | 11/2018 |
| CN | 109360825 A | 2/2019 |
| CN | 111742411 A | 10/2020 |
| JP | H05283674 A | 10/1993 |
| JP | 2003282865 A | 10/2003 |
| WO | 2019/149581 A1 | 8/2019 |
| WO | 2019158594 A1 | 8/2019 |
| WO | 2020201361 A1 | 10/2020 |
| WO | 2022/048919 A1 | 3/2022 |

* cited by examiner

BIDIRECTIONAL THYRISTOR DEVICE

CROSS-REFERENCE TO RELATED APPLICATIONS

This application is US National Stage of International Patent Application PCT/EP2021/082491, filed Nov. 22, 2021, which claims priority to European Patent Application No. 20209815.8, filed on Nov. 25, 2020, the contents of which is incorporated herein by reference.

A bidirectional thyristor device is specified.

Various applications require cost efficient antiparallel connected thyristors like the classical Flexible Alternating Current Transmission Systems (FACTS). They are beneficial also for the next generation valve concepts based on voltage source converters (VSC) for high-voltage direct-current (HVDC) transmission generally called Hybrid Multi Modular Converters (MMC).

A bidirectional control thyristor (BCT) may be obtained by two monolithically integrated antiparallel thyristor functions formed by two separated, individually triggered regions on one wafer. However, the process flow is quite complex and the electrical parameters dependent on the device area are halved. For example, the surge current is half of that of a full-wafer device and the thermal resistance of the thyristor is twice as big as that of the single thyristor at the same size wafer.

Document WO 2019/158594 A1 describes a so-called BiPCT concept, where the device has a common p-n-p region for both antiparallel p-n-p-n sections. This concept allows to obtain short commutation turn-off times. However, the device is not optimized with respect to short turn-on times and high di/dt capability at the same time.

It is therefore an object of the invention to provide a device with short turn-on and turn-off times.

This object is obtained, inter alia, by a bidirectional thyristor device according to claim 1. Developments and expediencies are subject of the further claims.

According to at least one embodiment the bidirectional thyristor device comprises a semiconductor body extending between a first main surface and a second main surface opposite to the first main surface. A first main electrode and a first gate electrode are arranged on the first main surface. A second main electrode and a second gate electrode are arranged on the second main surface. The first main electrode comprises a plurality of first segments that are spaced apart from one another wherein at least some of the first segments are completely surrounded by the first gate electrode in a view onto the first main surface. The second main electrode comprises a plurality of second segments that are spaced apart from one another wherein at least some of the second segments are completely surrounded by the second gate electrode in a view onto the second main surface. For example, one first segment acts as a cathode for a first thyristor functional element via the at least one first emitter region and as an anode for a second thyristor functional element via the at least one first emitter short region.

During operation of the bidirectional thyristor device the thyristor device may be turned on in two opposite current directions via the first and second gate electrodes. Afterwards, it can be turned-off by load commutation. The gate electrodes surrounding segments of the associated main electrode allow to obtain a device that turns on very fast. For example, the gate electrodes may be distributed over the whole first and second main surfaces. This way the boundary between the gate electrode and cathode is maximized to facilitate the fast turn-on with high di/dt turn-on capability.

According to at least one embodiment of the bidirectional thyristor device the semiconductor body comprises a first base layer of a first conductivity type, a second base layer of the first conductivity type and a third base layer of a second conductivity type different from the first conductivity type which is arranged between the first base layer and the second base layer. For example, the first conductivity type is p-type and the second conductivity type is n-type or vice versa.

For example, each of the first segments of the first main electrode adjoins at least one first emitter region of the second conductivity type and at least one first emitter short region of the first conductivity type.

Accordingly, each of the second segments of the second main electrode adjoins at least one second emitter region of the second conductivity type and at least one second emitter short region of the first conductivity type.

The third base layer may be completely unstructured in lateral direction, i.e. in a direction extending in parallel to the first main surface. A separation region between two antiparallel thyristors may be dispensed with the benefit that each thyristor utilizes full wafer area.

According to at least one embodiment of the bidirectional thyristor device the first gate electrode forms an ohmic contact with the first base layer. This means, for instance, that there is no p-n junction between the first gate electrode and the first base layer. Accordingly, the second gate electrode may form an ohmic contact with the second base layer.

According to at least one embodiment of the bidirectional thyristor device one segment of the first electrode acts as a cathode for a first thyristor functional element via the first emitter region and as an anode for a second thyristor functional element via the first emitter short region.

The first thyristor functional element and the second thyristor functional element may both use the entire area of the p-n junctions formed between the first base layer and the third base layer and between the second base layer and the third base layer.

With respect to the blocking direction the first thyristor functional element and the second thyristor functional element are arranged in antiparallel, for instance. In other words, cathode short regions of one thyristor functional element act as anode regions of the antiparallel thyristor functional element at the same time.

For example, the described configuration of the thyristor device results in two antiparallel connected thyristor structures (the first thyristor functional element and the second thyristor functional element) within the same device with an interdigitation of anode, cathode and gate regions to avoid the necessity of separation regions between the two antiparallel thyristors.

Furthermore, the length of the gate-cathode boundary may increase, resulting in an enhanced di/dt capability for fast turn-on. At the same time the dV/dt capability may remain unchanged.

Furthermore, a very low recovery charge Qrr and turn-off time tq as well as a very high surge current capability close to that of a single thyristor of the same size may be obtained.

According to at least one embodiment of the bidirectional thyristor device the first gate electrode comprises a first grid structure with a plurality of first cells. The first cells may have a polygonal shape in a view onto the first main surface. For instance the first cells may have the shape of a hexagon, an octagon or a tetragon. For instance the thyristor device comprises between 20 and 2000 first cells inclusive at a wafer with diameter of about 100 mm. The number of cells may be varied in wide ranges depending on the specific requirements on the thyristor device.

According to at least one embodiment of the bidirectional thyristor device the first grid structure forms a honeycomb pattern at least in regions. For instance the honeycomb pattern is formed by regular hexagons.

According to at least one embodiment of the bidirectional thyristor device a length of one side of at least one of the first cells is between 500 μm and 5000 μm inclusive, for instance between 900 μm and 3000 μm inclusive.

According to at least one embodiment of the bidirectional thyristor device a width of one side of at least one of the first cells is between 100 μm and 2000 μm inclusive, for instance between 100 μm and 500 μm inclusive.

The terms "length" and "width" refer to extensions in lateral direction. Thicknesses refer to the extent in vertical direction, i.e. perpendicular to the first main surface.

According to at least one embodiment of the bidirectional thyristor device a maximum lateral extent of at least one first emitter short region is between 50 μm and 1000 μm inclusive, for instance between 100 μm and 500 μm inclusive.

According to at least one embodiment of the bidirectional thyristor device exactly one emitter short region is arranged within one of the first cells.

According to at least one embodiment of the bidirectional thyristor device a plurality of first emitter short regions is arranged within one of the first cells. For example the number of first emitter short regions within one of the first cells amounts to between 2 and 100 inclusive.

According to at least one embodiment of the bidirectional thyristor device at least two first emitter short regions arranged within the same first cell are different from one another with respect to the maximum lateral extent, for example by at least 5 μm or at least 10 μm or at least 20 μm. In the case of a circular first emitter short region the maximum lateral extent corresponds to the diameter of the circle. However, other geometric base shapes may also apply for the first emitter short regions.

For example the emitter short regions arranged closer to the edge of the first segments are smaller than the maximum lateral extent of a first emitter short region arranged closer to the center of the respective first segment.

For example the maximum lateral extent of the first emitter short regions closer to the edge of the first segment is between 50 μm and 250 μm inclusive while a first emitter short region arranged closer to the center of the first segment has a maximum lateral extent between 150 μm and 500 μm inclusive.

According to at least one embodiment of the thyristor device an edge-to-edge distance between two emitter shorts within the same first cell is between 200 μm and 1000 μm inclusive, for instance between 300 μm and 500 μm inclusive.

According to at least one embodiment of the thyristor device an edge-to-edge distance between the first grid structure and the first emitter short arranged closest to the first grid structure is between 50 μm and 400 μm inclusive, for instance between 100 μm and 200 μm inclusive. This distance may have impact on the capability to block fast voltage transients under forward blocking (so-called dV/dt capability) and commutation turn-off time. Devices with closely spaced first emitter short regions may be easier to turn off.

The above parameters may take into account design rules that do not apply for existing device concepts. For instance this is because the emitter short regions on the cathode side of one thyristor functional element act as anode regions for the antiparallel thyristor functional element at the same time.

The above features described in connection with the configuration on the first main surface may also apply for the second main surface. Thus, on the second main surface a second grid structure with second cells corresponding to the first grid structure and the first cells may be provided.

Likewise second emitter regions corresponding to the first emitter regions and second emitter short regions corresponding to the first emitter short regions may be provided.

According to at least one embodiment of the thyristor device, an amplifying gate structure is integrated into at least one of the first gate electrode and the second gate electrode. The amplifying gate structure helps to obtain short turn-on times and homogeneous turn-on at large area wafers. The inherent amplification of gate current by the device itself may avoid the necessity of bulky driving circuits. By using an amplifying gate structure both for the first gate electrode and the second electrode short turn-on times may be obtained in both current directions.

According to at least one embodiment of the thyristor device the first gate electrode and the second gate electrode have the same base shape. In other words the second gate electrode represents a copy or at least a similar copy of the first gate electrode.

A symmetric behaviour of the thyristor device with respect to both current directions is facilitated in this manner.

In the exemplary embodiments and figures similar or similarly acting constituent parts are provided with the same reference signs. Generally, only the differences with respect to the individual embodiments are described. Unless specified otherwise, the description of a part or aspect in one embodiment applies to a corresponding part or aspect in another embodiment as well.

The elements illustrated in the figures and their size relationships among one another are not necessarily true to scale. Rather, individual elements or layer thicknesses may be represented with an exaggerated size for the sake of better representability and/or for the sake of better understanding.

Figure 1A:
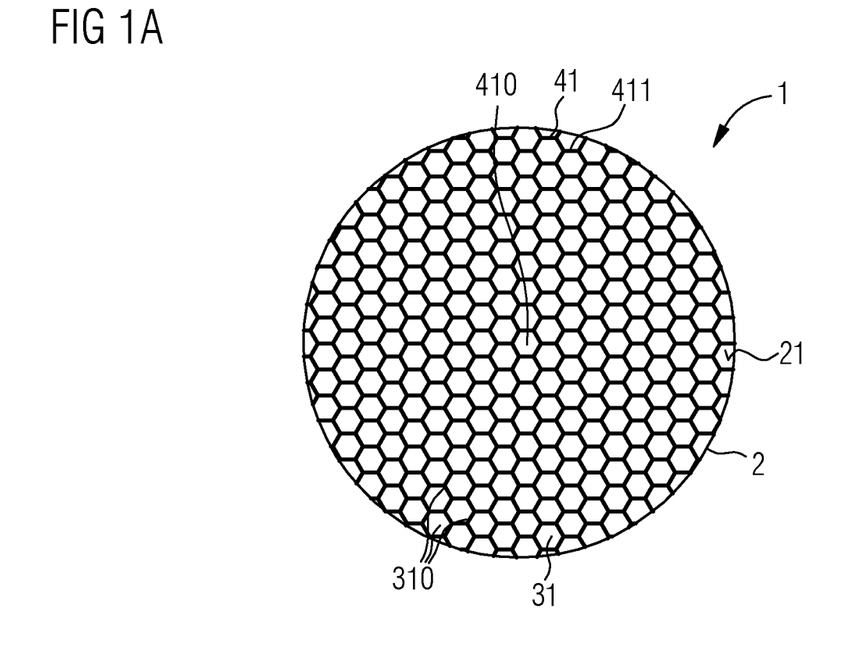
FIG. 1A shows an exemplary embodiment of the bidirectional thyristor device with a central gate electrode pad in top view.

A schematic top view onto a bidirectional thyristor device 1 according to an exemplary embodiment is shown in FIG. 1A. A first main electrode 31 and a first gate electrode 41 are arranged on a first main surface 21 of a semiconductor body 2 of the bidirectional thyristor device 1.

The first main electrode 31 comprises a plurality of first segments 310 that are spaced apart from one another. At least some of the first segments 310, for instance at least 50%, or at least 90% or all of the first segments are completely surrounded by the first gate electrode 41 in a view onto the first main surface 21.

The first gate electrode 41 comprises a first grid structure 411 and a first gate electrode pad 410. The first gate electrode pad 410 is configured as an external contact for the application of an external electrical voltage and current to the first gate electrode 41.

In the exemplary embodiments shown in FIGS. 1A through 1E the first grid structure 411 comprises a plurality of first cells 4110 of hexagonal shape thereby forming a honeycomb structure. However, other polygonal first cells may also apply for the first grid structure 411, for example tetragons or octagons.

Figure 1B:
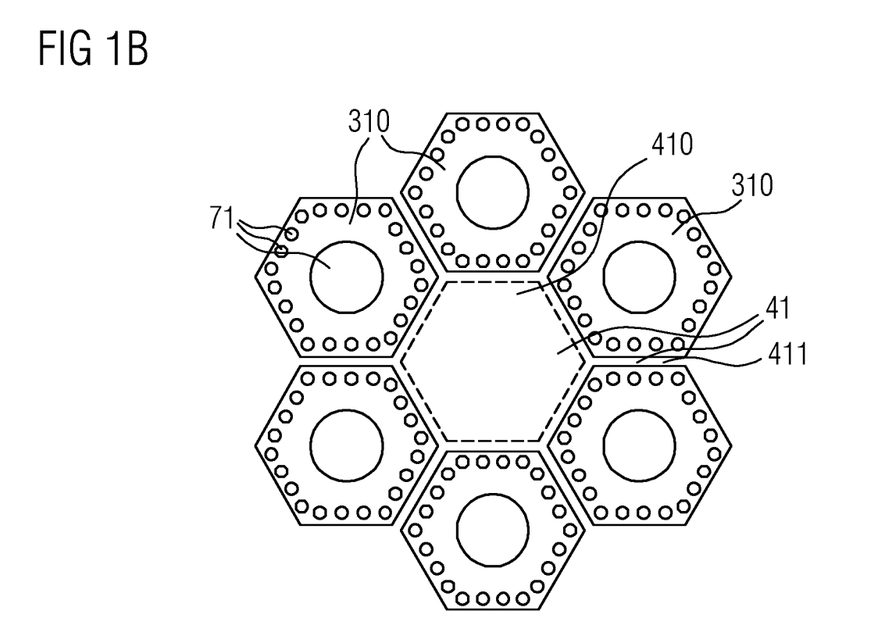
FIG. 1B shows a detail of a top view according to an exemplary embodiment of the bidirectional thyristor device.
Figure 1C:
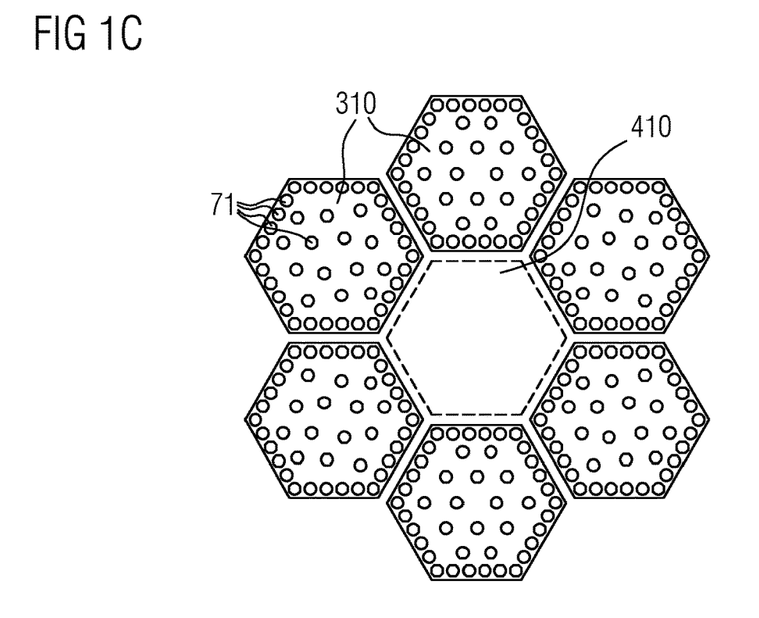
FIG. 1C shows a detail of a top view according to a further exemplary embodiment of the bidirectional thyristor device.
Figure 1D:
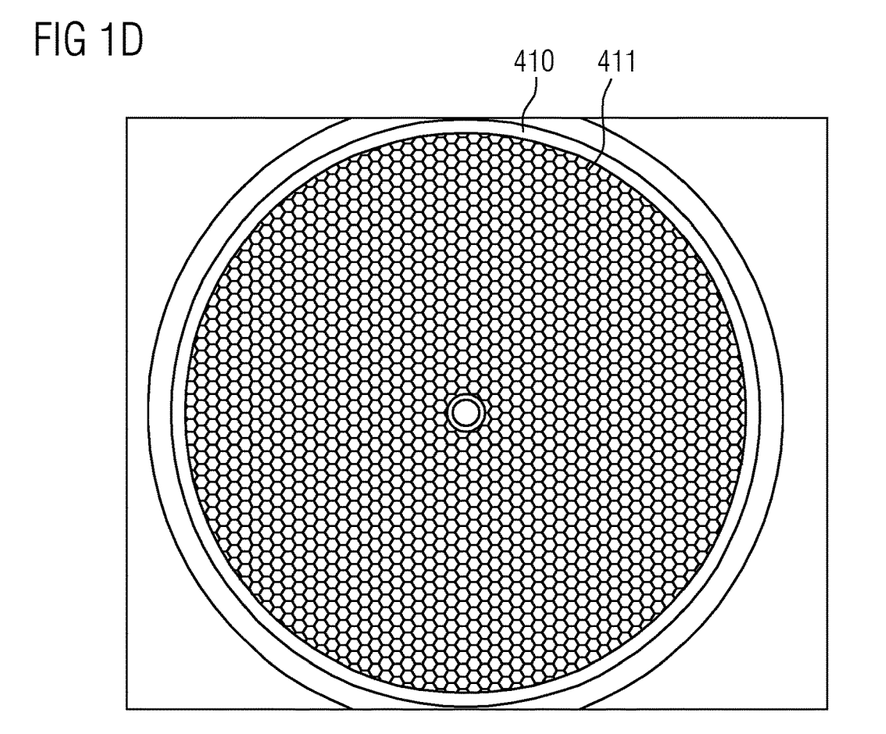
FIG. 1D illustrates a gate structure of an exemplary embodiment of the bidirectional thyristor device based on lithographic mask.
Figure 1E:
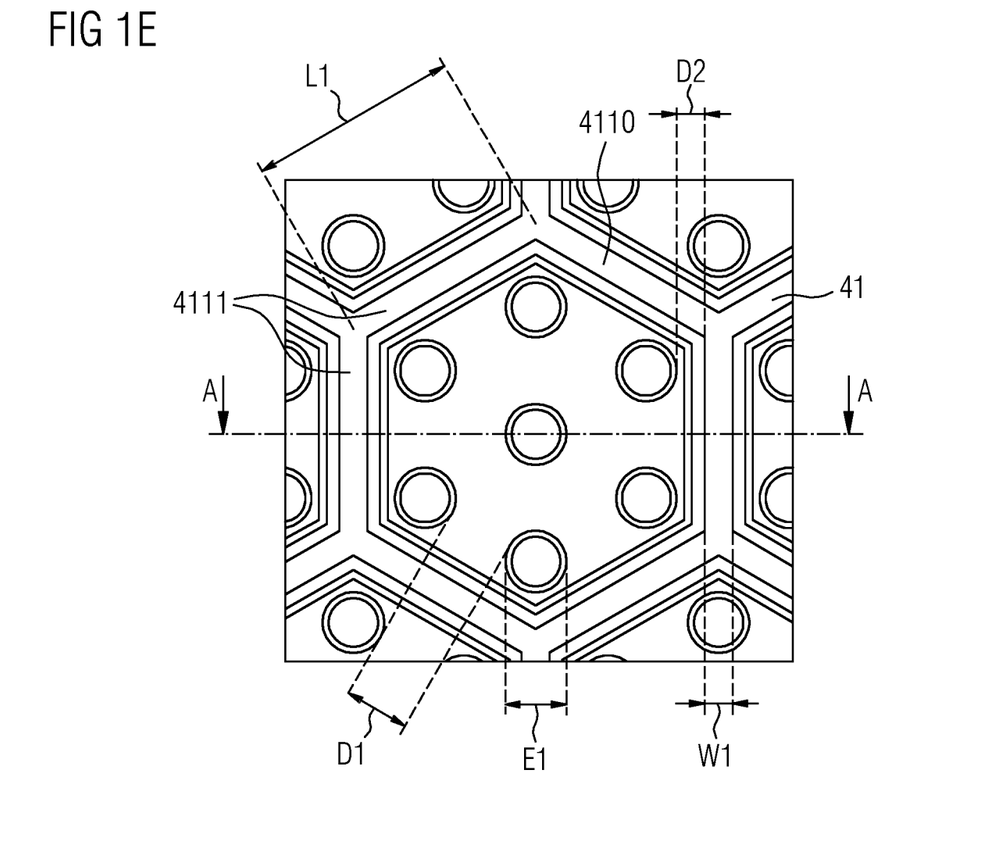
FIG. 1E shows a detail of FIG. 1F.
Figure 1F:
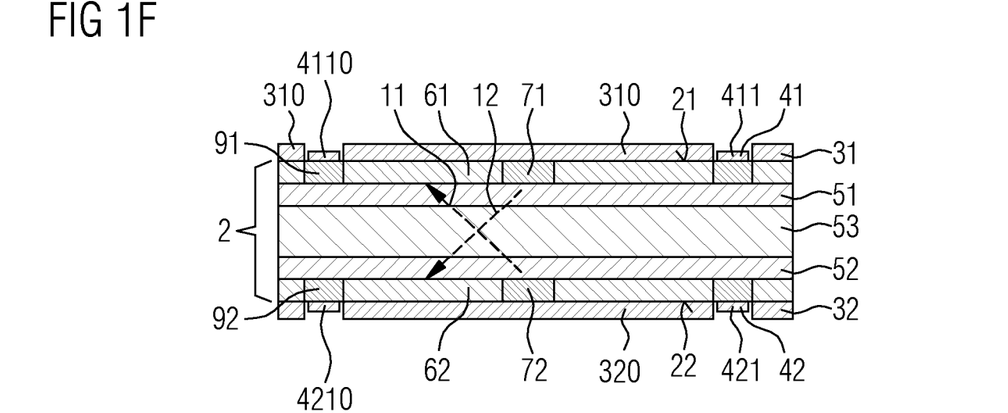
FIG. 1F shows a cross-sectional view of a detail of an exemplary embodiment of a bidirectional thyristor device.

As illustrated in the cross-sectional view of FIG. 1F, a second main electrode 32 and a second gate electrode 42 are arranged on a second main surface 22 of the semiconductor body arranged on the opposite side of the first main surface 21. Like the first main electrode 31, the second main electrode 32 is split into a plurality of second segments 320. At least some of the second segments 320, for instance at least 50%, or at least 90% or all of the second segments 320 are completely surrounded by the second gate electrode 42 in a view onto the second main surface 22.

The semiconductor body 2 comprises a first base layer 51 and a second base layer 52 of a first conductivity type. A third base layer 53 of a second conductivity type different than the first conductivity type is arranged between the first base layer 51 and the second base layer 52 in vertical direction. Each of the first segments 310 of the first main electrode 31 adjoins at least one first emitter region 61 of the second conductivity type and at least one first emitter short region 71 of the first conductivity type. For instance the first conductivity type is p-type and the second conductivity type is n-type or vice versa.

Each of the second segments 320 of the second main electrode 32 adjoins at least one second emitter region 62 of the second conductivity type and at least one second emitter short region 72 of the first conductivity type.

The first gate electrode 41 forms an ohmic contact with the first base layer 51 via a first gate contact region 91 of the semiconductor body 2 adjoining the first main surface 21. The second gate electrode 42 forms an ohmic contact with the second base layer 52 via a second gate contact region 92 of the semiconductor body 2 adjoining the second main surface 22. The first gate contact region 91 and the second gate contact region 92 are of the same conductivity type as the first base layer 51.

As schematically shown in FIG. 1F using two arrows, the bidirectional thyristor device 1 includes a first thyristor functional element 11 and a second thyristor functional element 12 representing two antiparallel connected thyristor structures.

The first main electrode 31 acts as a cathode for the first thyristor functional element 11 via the first emitter region 61. For the second thyristor functional element 12 the first main electrode 31 acts as an anode via the first emitter short region 71.

The first thyristor functional element 11 is formed by second emitter short region 72 acting as an anode, second base layer 52, third base layer 53, first base layer 51 and first emitter region 61. Accordingly, the second thyristor functional element 12 is formed by first emitter short region 71, first base layer 51, third base layer 53, second base layer 52, and second emitter region 62. Consequently, the emitter short regions 71, 72 also fulfil the function of an anode for the associated antiparallel thyristor functional element.

Between the first base layer 51 and the third base layer 53 as well as between the third base layer 53 and the second base layer 52 p-n junctions extending over the entire area of the semiconductor body 2 are formed. Both the first thyristor functional element 11 and the second thyristor functional element 12 may thus use the entire area for these p-n junctions. A high surge current capability close to that of a single thyristor of the same size may be obtained in this manner. A good turn-off capability by voltage commutation with very low recovery charge Qrr and short turn-off times tq may be obtained.

During operation of the bidirectional thyristor device 1 the first segments 310 of the first main electrode 31 may be electrically contacted to the same electrical potential, for instance by pressing a conductive plate or conductive wafer against the first main electrode 31. As shown in FIG. 1F, the thickness of the first gate electrode 41 within the first grid structure 411 is smaller than that of the first main electrode 31. Thus, the first grid structure 411 does not form an electrical contact to the plate or wafer. This applies to the second main electrode 32 as well.

The semiconductor body 2 comprises silicon, for example. However, other semiconductor materials may also be used, for instance wide bandgap materials like SiC.

In FIG. 1D the structure of the first gate electrode 41 is illustrated by way of a photolithography mask for a wafer having a diameter of 100 mm. A device of this size exemplarily has several hundred first cells formed by the first grid structure 411. However, the number of first cells may vary within wide limits depending on the intended application of the bidirectional thyristor device 1.

A view onto the first main surface 21 may correspond to a view onto the second main surface 22. Therefore, views onto the second main surface 22 are not explicitly shown in the Figures.

Features and parameters described in connection with the configuration on the first main surface 21, for example in connection with the first main electrode 31, the first gate electrode 41, the first grid structure 411, the first cells 4110, the first emitter region 61 and the first emitter short region 71 may likewise also apply for the corresponding element on the second main surface 22, for example for the second main electrode 32, the second gate electrode 42, the second grid structure 421, the second cells 4210, the second emitter region 62, and the second emitter short region 72, respectively.

For example, the bidirectional thyristor device 1 may be symmetrical or at least substantially symmetrical with respect to a plane extending through the third base layer 53.

FIGS. 1B, 1C and 1E illustrate different examples for the arrangement of first emitter short regions 71 within the first segments 310 of the first main electrode 31.

In the example shown in FIG. 1B, each first segment 310 overlaps with a plurality of first emitter short regions 71 wherein one first emitter short region 71 is arranged in the center of the first segment 310, whereas the further first emitter short regions 71 are arranged along the circumference of the first segments 310.

In the example of FIG. 1C, the first emitter short region 71 in the center is replaced by several smaller first emitter short regions 71.

Various parameters of the bidirectional thyristor device 1 are described in the following in connection with FIG. 1E. However, the parameters may also apply for the further examples.

A length L1 of one side 4111 of the first cells 4110 is between 500 µm and 5000 µm or between 900 µm and 3000 µm inclusive, for instance. The larger the length L1, the larger the contiguous area of the first segments 310 of the first main electrode 31.

A width W1 of one side of at least one of the first cells 4110 is between 100 µm and 2000 µm inclusive, for instance between 100 µm and 500 µm inclusive. The width of the sides together with their thickness define the cross-section of the first grid structure 411. The thickness of the first grid structure 411 is between 3 µm and 30 µm inclusive or between 5 µm and 12 µm inclusive, for instance. For instance, using these parameters the cross-section of the first grid structure 411 is big enough to avoid a significant voltage drop along the gate path from the first gate electrode pad 410 to the outermost areas of the first grid structure 411.

A maximum lateral extent E1 of the first emitter short regions 71 is between 50 µm and 1000 µm or between 100 µm and 500 µm inclusive, for instance. As shown in FIG. 1B, for instance, first emitter short regions 71 arranged within one first cell may also have different values for the maximum lateral extent.

For example, first emitter short regions 71 arranged close to the edge of the first cell may have a diameter between 50 µm and 250 µm inclusive wherein first emitter short region 71 arranged closer to the center of the cell may have a diameter between 150 µm and 500 µm inclusive.

An edge-to-edge distance D1 between two emitter short regions 71 within the same first cell is between 200 µm and 1000 µm inclusive or between 300 µm and 500 µm inclusive, for instance. The distance between the emitter short regions may be chosen appropriately to provide sufficiently high dV/dt capability and low values for the turn-off time tq.

An edge-to-edge distance D2 between the first grid structure 411 and the first emitter short region arranged closest to the first grid structure is between 50 µm and 400 µm or between 100 µm and 200 µm inclusive, for instance. A distance in this range may provide a good commutation turn-off capability.

A further improvement of the turn-off capability may be obtained by an irradiation with ions from both the first main surface 21 and the second main surface 22. For example, this may be obtained by proton irradiation of the first base layer 51 and the second base layer 52 close to an n-type third base layer 53. This way of local lifetime control by proton irradiation is described in document WO 2019/158594 A1, the disclosure content of which is hereby incorporated by reference.

The described device structure provides a high di/dt capability due to the massively increased interface area between the gate electrodes and the main electrodes on the first and second main surfaces. Compared to conventional devices, short turn-on times after application of a gate current pulse may be obtained.

In conventional devices, the distance of a short region from a main electrode edge is kept low since it is inversely proportional to the dV/dt capability. This reduces the di/dt capability. In contrast, high values for dV/dt and di/dt may be obtained at the same time for the described thyristor device, for example due to the massively increased gate-cathode area.

For example, the described bidirectional thyristor device 1 is suited for power applications, for instance applications requiring blocking voltages of 1000 V or more, requiring antiparallel connected fast phase control thyristors, for instance in HVDC or FACTS applications.

The described bidirectional thyristor device may be fabricated in a very efficient manner so that a cost reduction may be obtained for those applications.

Figure 1G:
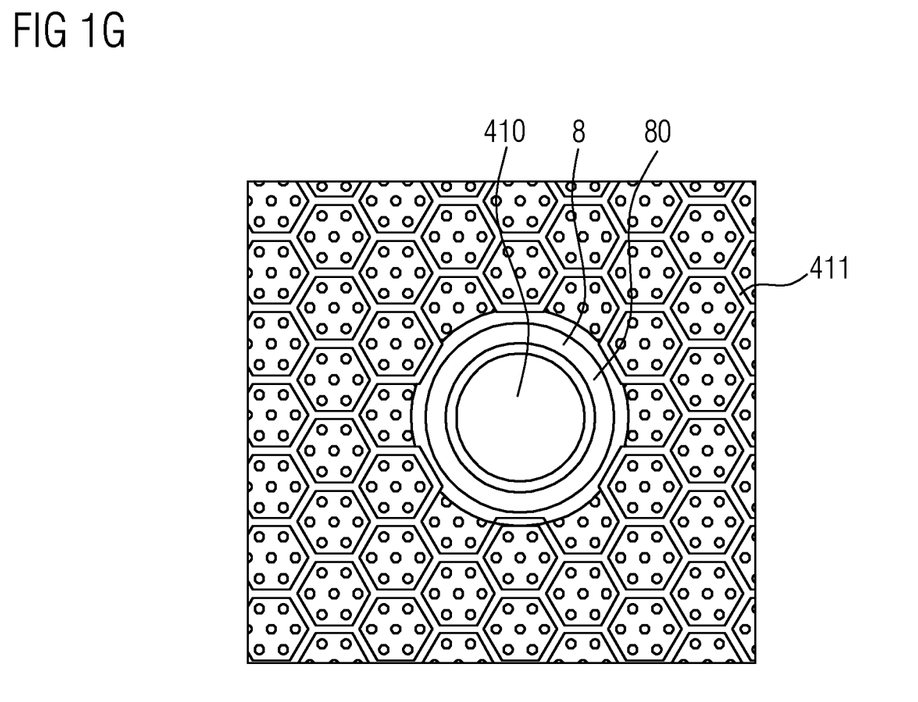
FIG. 1G shows a further detail of FIG. 1F including a top view of the gate electrode pad and the amplifying gate structure.
Figure 1H:
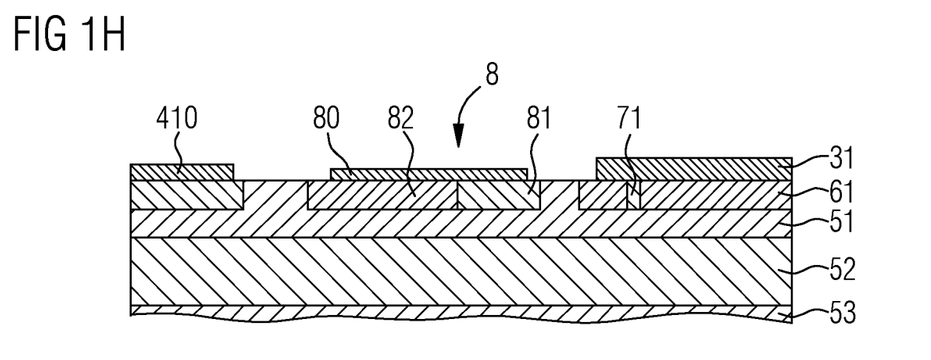
FIG. 1H illustrates the central part of an amplifying gate structure of the bidirectional thyristor device.

As shown in FIGS. 1G and 1H, an amplifying gate structure 8 may be integrated into the first gate electrode 41 and/or the second gate electrode 42. For easier representation, the cross-sectional view of FIG. 1H only shows the upper part of the device near the first main surface.

The amplifying gate structure 8 comprises a section 80 of the first gate electrode 41. In the exemplary embodiment shown in FIG. 1G the section 80 is formed as a ring extending around the first gate electrode pad 410. The section 80 overlaps with a first partial region 81 of the first conductivity type and a second partial region 82 of the second conductivity type. This results in an amplification of current pulses applied to the first gate electrode 41 via the first gate electrode pad 410. In principle, it is the Darlington configuration of two bipolar transistors.

Figure 2A:
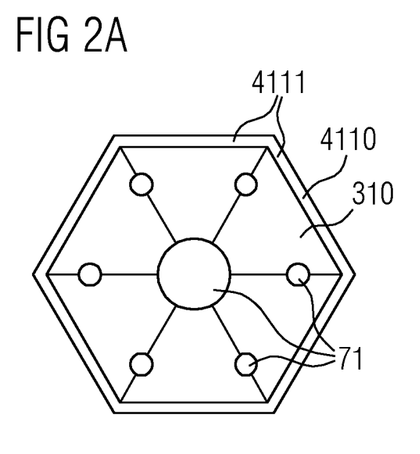
FIGS. 2A, 2B, 2C, and 2D each show a detail of an exemplary embodiment of the bidirectional thyristor device in top view.
Figure 2B:
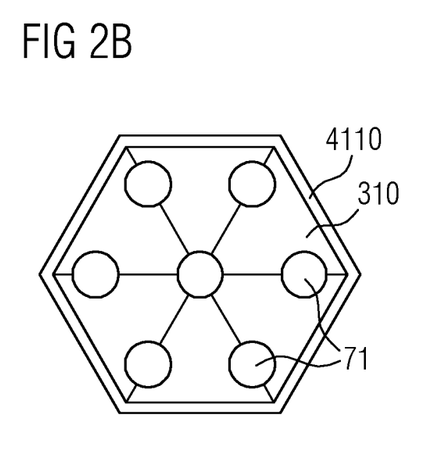
Figure 2C:
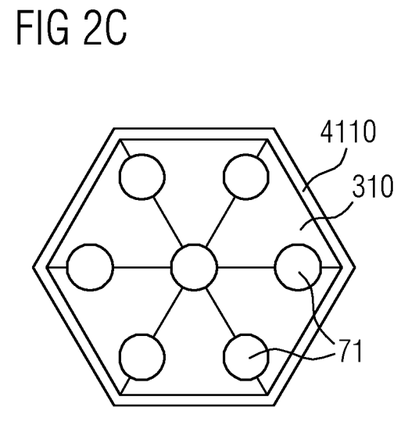

FIGS. 2A, 2B, 2C and 2D illustrate further examples of the arrangement of the first emitter short region 71 within the first cells 4110. In these examples one first emitter short region 71 is arranged in the center of the hexagonal cell 4110. In the examples of FIGS. 2A, 2B and 2C, six further first emitter short regions 71 are arranged close to the corners of the hexagon.

In the example of FIG. 2A, the first emitter short region arranged in the center is larger than the further first emitter short regions 71. For a length L1 of 930 µm a distance between the outer first emitter short regions 71 is 475 µm. An edge-to-edge distance between an outer first emitter short region and the center first emitter short region is 350 µm.

In the example of FIG. 2B the first emitter short regions 71 have the same maximum lateral extent E1. For values of L1=980 µm and E1=300 µm, for instance, the distances between next neighbors of the first emitter short regions 71 are equal, namely 300 µm.

In the exemplary embodiment of FIG. 2C the first emitter short region 71 in the center is smaller than the further first emitter short regions 71. For example, with L1=1080 µm and a maximum lateral extent of the first emitter short region E1 of 200 µm and a maximum lateral extent E1 of 300 µm for the remaining first emitter short regions, equal distances between next neighbors of first emitter short regions 71 of 400 µm may be obtained. The above sizes and placement of the shorts may provide an optimal technology curve VT-Qrr.

Figure 2D:
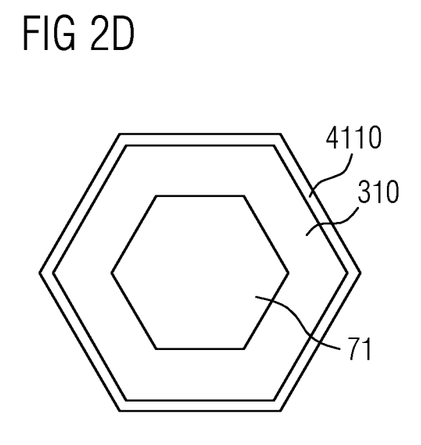

In the exemplary embodiment of FIG. 2D, exactly one first emitter short region 71 is arranged within the first cells 4110. For example, the first emitter short region 71 is of the same geometric shape as the first cell 4110, for instance of a hexagonal shape. Thus, the edges of the first cell 4110 and the edges of the first emitter short region 71 run in parallel. The emitter short region 71 is surrounded by the first segment 310.

Using the above parameters optimum combinations of electric parameters relevant for the specific application may be obtained, for instance with respect to Qrr, ON-state voltage VT, turn-off time tq, turn-on di/dt capability and/or (di/dt)max capability.

The semiconductor body 2 may be a full wafer as described in connection with FIG. 1D. However, the semiconductor body 2 may also be a part of a wafer, so that the bidirectional thyristor device 1 is a chip obtained by singulation of a processed wafer into individual devices. In this case, the bidirectional thyristor device may comprise a planar pn junction termination, for example using guard rings or a variation lateral doping (VLD). At the same time deep p-type sinks may be provided for reverse blocking capability.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS 1 bidirectional thyristor device
11 first thyristor functional element
12 second thyristor functional element
2 semiconductor body
21 first main surface
22 second main surface
31 first main electrode
310 first segments
32 second main electrode
320 second segments
41 first gate electrode
410 first gate electrode pad
411 first grid structure
4110 first cells
4111 side
42 second gate electrode
421 second grid structure
4210 second cells
51 first base layer
52 second base layer
53 third base layer
61 first emitter region
62 second emitter region
71 first emitter short region
72 second emitter short region
8 amplifying gate structure
80 section
81 first partial region (first conductivity type)
82 second partial region (second conductivity type)
91 first gate contact region
92 second gate contact region
L1 length of side
W1 width of side (covered by first/second gate electrode)
E1 maximum lateral extent of first emitter short region
D1 edge-to-edge distance
D2 edge-to-edge distance

The invention claimed is:

1. A bidirectional thyristor device comprising:
a semiconductor body extending between a first main surface and a second main surface,
a first main electrode arranged on the first main surface,
a second main electrode arranged on the second main surface,
a first gate electrode arranged on the first main surface,
a second gate electrode arranged on the second main surface, wherein
the first main electrode comprises a plurality of first segments that are spaced apart from one another, wherein at least some of the first segments are completely surrounded by the first gate electrode in a view onto the first main surface, and
the second main electrode comprises a plurality of second segments that are spaced apart from one another, wherein at least some of the second segments are completely surrounded by the second gate electrode in a view onto the second main surface, and
one of the plurality of first segments acts as a cathode for a first thyristor functional element via the at least one first emitter region and as an anode for a second thyristor functional element via at least one first emitter short region.

2. The bidirectional thyristor device according to claim 1, wherein the semiconductor body comprises
a first base layer of a first conductivity type,
second base layer of the first conductivity type,
a third base layer of a second conductivity type different than the first conductivity type arranged between the first base layer and the second base layer,
wherein each of the first segments adjoins the at least one first emitter region of the second conductivity type and at the least one first emitter short region of the first conductivity type.

3. The bidirectional thyristor device according to claim 2, wherein the first gate electrode forms an ohmic contact with the first base layer.

4. The bidirectional thyristor device according to claim 1, wherein each of the second segments of the second main electrode adjoins at least one second emitter region of the second conductivity type and at least one second emitter short region of the first conductivity type.

5. The bidirectional thyristor device according to claim 1, wherein the first gate electrode comprises a first grid structure with a plurality of first cells having a polygonal shape in a view onto the first main surface.

6. The bidirectional thyristor device according to claim 5, wherein the first grid structure forms a honeycomb pattern at least in regions.

7. The bidirectional thyristor device according to claim 5, wherein a length of one side of at least one of the first cells is between 500 µm and 5000 µm inclusive.

8. The bidirectional thyristor device according to claim 5, wherein a width of one side of at least one of the first cells is between 100 µm and 2000 µm inclusive.

9. The bidirectional thyristor device according to claim 5, wherein a maximum lateral extent of at least one first emitter short region is between 50 µm and 1000 µm inclusive.

10. The bidirectional thyristor device according to claim 5, wherein a plurality of first emitter short regions is arranged with one of the first cells.

11. The bidirectional thyristor device according to claim 10, wherein at least two first emitter short regions arranged within the same first cell differ from one another with respect to the maximum lateral extent.

12. The bidirectional thyristor device according to claim 10, wherein an edge-to-edge distance between two emitter short regions within the same first cell is between 200 µm and 1000 µm inclusive.

13. The bidirectional thyristor device according to claim 5, wherein an edge-to-edge distance between the first grid structure and the first emitter short region arranged closest to the first grid structure is between 50 µm and 400 µm inclusive.

14. The bidirectional thyristor device according to claim 1, wherein an amplifying gate structure is integrated into at least one of the first gate electrode and the second gate electrode.

15. The bidirectional thyristor device according to claim 1,
wherein the first gate electrode and the second gate electrode have the same base shape.

\* \* \* \* \*